(12) United States Patent
Terasaki

(10) Patent No.: US 11,887,909 B2
(45) Date of Patent: Jan. 30, 2024

(54) COPPER/TITANIUM/ALUMINUM JOINT, INSULATING CIRCUIT SUBSTRATE, INSULATING CIRCUIT SUBSTRATE WITH HEAT SINK, POWER MODULE, LED MODULE, AND THERMOELECTRIC MODULE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 96 days.

(21) Appl. No.: 16/959,160

(22) PCT Filed: Feb. 13, 2018

(86) PCT No.: PCT/JP2018/004835
§ 371 (c)(1),
(2) Date: Jun. 30, 2020

(87) PCT Pub. No.: WO2019/159219
PCT Pub. Date: Aug. 22, 2019

(65) Prior Publication Data
US 2020/0343158 A1   Oct. 29, 2020

(51) Int. Cl.
*H01L 23/373* (2006.01)
*H01L 33/64* (2010.01)
*H10N 10/17* (2023.01)

(52) U.S. Cl.
CPC ........ *H01L 23/3735* (2013.01); *H01L 33/641* (2013.01); *H01L 33/647* (2013.01); *H10N 10/17* (2023.02)

(58) Field of Classification Search
CPC ... H01L 23/15; H01L 23/3736; H01L 23/142; H01L 23/3735; H01L 35/32; H01L 33/647; H01L 33/641; H10N 10/17
(Continued)

(56) References Cited

U.S. PATENT DOCUMENTS 6,164,524 A    12/2000  Iwadachi
2009/0014505 A1 *  1/2009  Cretegny ............... B23K 35/22
                                                228/248.1
(Continued)

FOREIGN PATENT DOCUMENTS

CN    105393347 A       3/2016
EP    3471517 A1 *      4/2019 ........... B23K 1/0016
(Continued)

OTHER PUBLICATIONS

International Search Report dated Apr. 24, 2018, issued for PCT/JP2018/004835 and English translation thereof.
(Continued)

*Primary Examiner* — David Chen
(74) *Attorney, Agent, or Firm* — Locke Lord LLP

(57) ABSTRACT

In a copper/titanium/aluminum bonded body of the present invention, a copper member made of copper or a copper alloy and an aluminum member made of aluminum or an aluminum alloy are bonded via a titanium layer, an intermetallic compound containing Cu and Ti is formed at a bonded interface of the copper member and the titanium layer, and a maximum value of a length $L_i$ of an intermetallic compound unformed part along the bonded interface is 20 μm or less in the bonding interface of the copper member and the titanium layer, the intermetallic compound unformed
(Continued)

part being a part free of formation of the intermetallic compound, and a ratio $\Sigma L_i/L_0$ is 0.16 or less, $\Sigma Li$ being a total length of the intermetallic compound unformed part along the bonded interface and of $L_0$ being a total length of the bonded interface along the bonded interface.

16 Claims, 8 Drawing Sheets

(58) Field of Classification Search
USPC .......... 174/252; 257/720, E31.041; 428/651
See application file for complete search history.

(56) References Cited

U.S. PATENT DOCUMENTS

| | | | |
|---|---|---|---|
| 2013/0043594 A1* | 2/2013 | Sasaki | C22C 9/02 438/106 |
| 2016/0152004 A1* | 6/2016 | Niino | H05K 1/09 428/673 |
| 2016/0167170 A1 | 6/2016 | Terasaki et al. | |
| 2017/0271238 A1* | 9/2017 | Terasaki | H01L 23/49811 |
| 2018/0166411 A1* | 6/2018 | Hine | H01L 24/83 |

FOREIGN PATENT DOCUMENTS

| | | | |
|---|---|---|---|
| JP | H04-172176 A | | 6/1992 |
| JP | 2004-231513 A | | 8/2004 |
| JP | 2014-177031 A | | 9/2014 |
| JP | 5725061 B2 | | 5/2015 |
| JP | 2016-041434 A | | 3/2016 |
| JP | 2016-048782 A | | 4/2016 |
| JP | 2016-058706 A | | 4/2016 |
| JP | 2017-228693 A | | 12/2017 |
| JP | 2017224656 A | * | 12/2017 |
| JP | 2018-008869 A | | 1/2018 |
| JP | 2018-046106 A | | 3/2018 |
| WO | WO-2016031754 A1 * | 3/2016 | .......... C04B 37/021 |
| WO | 2017/213207 A1 | | 12/2017 |

OTHER PUBLICATIONS

Office Action dated Jan. 7, 2020, issued for Japanese Patent Application No. 2016-178724 and English translation thereof.
Supplementary European Search Report dated Jul. 28, 2021, issued for European Patent Application No. 18906230.0.
Notice of Allowance dated May 6, 2021, issued for TW107105421 and English translation of the Search Report.
Office Action dated Dec. 28, 2022, issued for CN201880087807.X and English translation of the Search Report.

* cited by examiner

COPPER/TITANIUM/ALUMINUM JOINT, INSULATING CIRCUIT SUBSTRATE, INSULATING CIRCUIT SUBSTRATE WITH HEAT SINK, POWER MODULE, LED MODULE, AND THERMOELECTRIC MODULE

TECHNICAL FIELD

The present invention relates to a copper/titanium/aluminum bonded body in which a copper member made of copper or a copper alloy and an aluminum member made of aluminum or an aluminum alloy are bonded via a titanium layer, as well as an insulating circuit substrate, an insulating circuit substrate with a heat sink, a power module, an LED module, and a thermoelectric module, which are provided with the same.

BACKGROUND ART

The power module, the LED module, and the thermoelectric module have a structure in which a power semiconductor element, an LED element, and a thermoelectric element are bonded to an insulating circuit substrate in which a circuit layer formed of a conductive material is provided on one surface of an insulating layer.

For example, power semiconductor elements for controlling large amounts of power used to control wind power generation, electric vehicles, hybrid vehicles, and the like generate a large amount of heat during operation, thus, ceramic substrates (insulating layers) formed of silicon nitride ($Si_3N_4$) excellent in heat resistance and insulation are widely used as substrates for mounting such power semiconductor elements.

In addition, the insulating circuit substrates described above may also be provided with a structure in which there is a circuit layer provided by bonding a metal sheet having excellent conductivity to one surface of a ceramic substrate (insulating layer) and in which a metal layer having excellent heat radiation is bonded to the other surface and integrated therewith.

Currently, the use of a bonded body is being studied in which an aluminum layer and a copper layer are laminated as a circuit layer and a metal layer of an insulating circuit substrate (power module substrate). For example, Patent Literature 1 proposes a bonded body in which a circuit layer and a metal layer are configured by bonding an aluminum layer and a copper layer via a titanium layer.

Further, in the power module, LED module, and thermoelectric module described above, insulating circuit substrates with heat sinks are also used in which a heat sink is bonded to the metal layer side of the insulating circuit substrate in order to efficiently radiate heat generated from a semiconductor element or the like mounted on a circuit layer.

For example, Patent Literature 1 proposes an insulating circuit substrate with a heat sink in which the metal layer is formed of aluminum or an aluminum alloy, the heat sink is formed of copper or a copper alloy, and the metal layer and the heat sink are bonded via a titanium layer.

In the insulating circuit substrate and the insulating circuit substrate with a heat sink described above, the bonding state of each bonded interface of the ceramic substrate and the aluminum layer, the aluminum layer and the titanium layer, and the titanium layer and the copper layer is evaluated by ultrasonic inspection or the like.

CITATION LIST

Patent Literature

[Patent Literature 1]
Japanese Patent No. 5725061

SUMMARY OF INVENTION

Technical Problem

Recently, there has been a trend for the heat generation density to increase in power semiconductor elements, LED elements, thermoelectric elements, and the like mounted on insulating circuit substrates and there is a demand for insulating circuit substrates in the related art to have greater reliability with respect to thermal cycles up to higher temperatures.

Currently, when an insulating circuit substrate and an insulating circuit substrate with a heat sink having a structure in which an aluminum layer and a copper layer are bonded via a titanium layer as described above are subjected to a thermal cycle load at a temperature higher than in the related art, peeling may occur at the bonded interface of the copper layer and the titanium layer.

The present invention was made in view of the circumstances described above and has an object of providing a copper/titanium/aluminum bonded body particularly excellent in reliability, in which it is possible to suppress peeling from occurring at a bonded interface of a copper member and a titanium layer even in a case of being subjected to a thermal cycle load at a temperature higher than in the related art, as well as an insulating circuit substrate, an insulating circuit substrate with a heat sink, a power module, an LED module, and a thermoelectric module, which are provided with the same.

Solution to Problem

In order to solve the problems described above, the present inventors conducted intensive studies and, as a result, found that an intermetallic compound of copper and titanium is formed at a bonded interface of a copper layer and a titanium layer, but that, in a part of the bonded interface, there is a region where this intermetallic compound is not provided (intermetallic compound unformed part) and peeling occurs in this intermetallic compound unformed part in a case of being subjected to a thermal cycle load at a temperature higher than in the related art. It was not possible to detect the intermetallic compound unformed part by ultrasonic inspection before the thermal cycle load.

The present invention was made based on the above findings and a copper/titanium/aluminum bonded body according to an aspect of the present invention is a copper/titanium/aluminum bonded body in which a copper member made of copper or a copper alloy and an aluminum member made of aluminum or an aluminum alloy are bonded via a titanium layer, in which an intermetallic compound containing Cu and Ti is formed at a bonded interface of the copper member and the titanium layer, and a maximum value of a length L of an intermetallic compound unformed part along the bonded interface is 20 µm or less in the bonding interface of the copper member and the titanium layer, the intermetallic compound unformed part being a part free of formation of the intermetallic compound, and a ratio $L_i/L_0$ is 0.16 or less, $\Sigma L_i$ being a total length of the intermetallic compound unformed part along the bonded interface and of $L_0$ being a total length of the bonded interface along the bonded interface.

According to the copper/titanium/aluminum bonded body with this configuration, in the bonded interface of the copper member and the titanium layer, a maximum value of the length $L_i$ of an intermetallic compound unformed part, where the intermetallic compound is not formed along the bonded interface, is 20 μm or less, thus, the Cu and Ti are sufficiently inter-diffused between the copper member and the titanium layer so as to provide the intermetallic compound described above and the bonding reliability of the copper member and titanium layer is excellent.

In addition, since a ratio $\Sigma L_i/L_0$ of a total length $\Sigma Li$ of the intermetallic compound unformed part along the bonded interface and a total length $L_0$ of the bonded interface is 0.16 or less, the ratio of the presence of the region where the intermetallic compound containing Cu and Ti is not provided is small and it is possible to suppress peeling from occurring with the intermetallic compound unformed part as a starting point even in a case of being subjected to a thermal cycle load at a temperature higher than in the related art.

An insulating circuit substrate according to an aspect of the present invention includes a ceramic substrate, and a circuit layer provided on one surface of the ceramic substrate, in which the circuit layer is the copper/titanium/aluminum bonded body described above.

According to the insulating circuit substrate with this configuration, since the circuit layer is formed of the copper/titanium/aluminum bonded body described above, even when an element having a high heat generation density is mounted on the circuit layer, peeling is suppressed from occurring at the bonded interface of the copper member and the titanium layer and the reliability is excellent.

In addition, an insulating circuit substrate according to an aspect of the present invention is an insulating circuit substrate including a ceramic substrate, a circuit layer provided on one surface of the ceramic substrate, and a metal layer provided on the other surface of the ceramic substrate, in which the metal layer is the copper/titanium/aluminum bonded body described above.

According to the insulating circuit substrate having this configuration, since the metal layer is formed of the copper/titanium/aluminum bonded body described above, the bonding reliability between the copper member and the titanium layer is excellent and it is possible to efficiently radiate heat from the element mounted on the circuit layer via the metal layer.

Further, an insulating circuit substrate according to an aspect of the present invention includes a ceramic substrate, a circuit layer provided on one surface of the ceramic substrate, and a metal layer provided on the other surface of the ceramic substrate, in which the circuit layer and the metal layer are the copper/titanium/aluminum bonded body described above.

According to the insulating circuit substrate having this configuration, since the circuit layer and the metal layer are formed of the copper/titanium/aluminum bonded body described above, even when an element having a high heat generation density is mounted on the circuit layer, peeling is suppressed from occurring at the bonded interface of the copper member and the titanium layer and the reliability is excellent. In addition, it is possible to efficiently radiate heat from the element mounted on the circuit layer via the metal layer.

An insulating circuit substrate with a heat sink according to an aspect of the present invention includes a ceramic substrate, a circuit layer provided on one surface of the ceramic substrate, a metal layer provided on the other surface of the ceramic substrate, and a heat sink bonded to the metal layer, in which the metal layer and the heat sink are the copper/titanium/aluminum bonded body described above.

According to the insulating circuit substrate with the heat sink having this configuration, since the metal layer and the heat sink are the copper/titanium/aluminum bonded body described above, peeling is suppressed from occurring at the bonded interface of the copper member and the titanium layer provided between the metal layer and the heat sink even during a high load and the reliability is excellent.

A power module according to an aspect of the present invention includes the insulating circuit substrate described above, and a power semiconductor element bonded to one surface side of the circuit layer.

In addition, a power module according to an aspect of the present invention includes the insulating circuit substrate with a heat sink described above, and a power semiconductor element bonded to one surface side of the circuit layer.

An LED module according to an aspect of the present invention includes the insulating circuit substrate described above, and an LED element bonded to one surface side of the circuit layer.

In addition, an LED module according to an aspect of the present invention includes the insulating circuit substrate with a heat sink described above, and an LED element bonded to one surface side of the circuit layer.

A thermoelectric module according to an aspect of the present invention includes the insulating circuit substrate described above, and a thermoelectric element bonded to one surface side of the circuit layer.

In addition, a thermoelectric module according to an aspect of the present invention includes the insulating circuit substrate with a heat sink described above, and a thermoelectric element bonded to one surface side of the circuit layer.

According to the power module, the LED module, and the thermoelectric module which are an aspect of the present invention, having the copper/titanium/aluminum bonded body described above makes it possible to suppress peeling from occurring at the bonded interface of the copper member and the titanium layer even during a high load and to improve the reliability of the power module, the LED module, and the thermoelectric module.

Advantageous Effects of Invention

According to the present invention, it is possible to provide a copper/titanium/aluminum bonded body in which it is possible to suppress peeling from occurring at a bonded interface of a copper member and a titanium layer even in a case of being subjected to a thermal cycle load at a temperature higher than in the related art and in which the reliability is particularly excellent, as well as an insulating circuit substrate, an insulating circuit substrate with a heat sink, a power module, an LED module, and a thermoelectric module, which are provided with the same.

DESCRIPTION OF EMBODIMENTS

Figure 1:
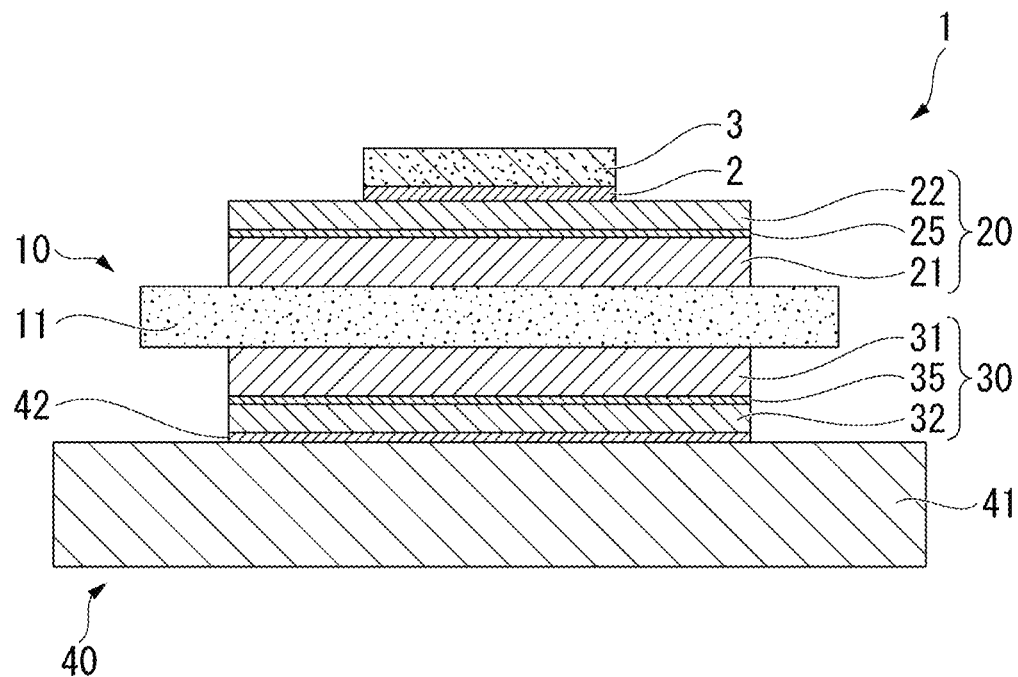
FIG. 1 is a cross-sectional view showing a copper/titanium/aluminum bonded body, an insulating circuit substrate, and a power module which are a first embodiment of the present invention.

A description will be given below of embodiments of the present invention with reference to the drawings. Each of the embodiments shown below is specifically described in order to improve understanding the gist of the invention and does not limit the present invention unless particularly specified. In addition, in the drawings used in the following description, in order to facilitate understanding of the features of the present invention, the main parts thereof may be shown as enlarged for convenience and the dimensional ratios and the like of the respective components are not necessarily the same as in practice.

First Embodiment

FIG. 1 shows a power module 1 using an insulating circuit substrate 10 according to the first embodiment of the present invention. In the insulating circuit substrate 10 shown in FIG. 1, the bonded body in the present embodiment is a circuit layer 20 in which an aluminum layer 21 as an aluminum member and a copper layer 22 as a copper member are bonded via a titanium layer 25, and a metal layer 30 in which an aluminum layer 31 as an aluminum member and the copper layer 32 as the copper member are bonded via a titanium layer 35.

The power module 1 shown in FIG. 1 is provided with the insulating circuit substrate 10, a power semiconductor element 3 bonded to one surface (the upper surface in FIG. 1) of the insulating circuit substrate 10 via a first solder layer 2, and a heat sink 41 bonded to the lower side of the insulating circuit substrate 10 via a second solder layer 42. The insulating circuit substrate 10 to which the heat sink 41 is bonded is an insulating circuit substrate with a heat sink 40 in the present embodiment.

The power semiconductor element 3 is formed of a semiconductor material such as Si. The first solder layer 2 for bonding the insulating circuit substrate 10 and the power semiconductor element 3 is, for example, a Sn—Ag-based, a Sn—Cu-based, a Sn—In-based, or a Sn—Ag—Cu-based solder material (so-called lead-free solder material).

The heat sink 41 is for radiating heat from the insulating circuit substrate 10 side. The heat sink 41 is formed of copper or a copper alloy and is formed of oxygen-free copper in the present embodiment. The second solder layer 42 for bonding the insulating circuit substrate 10 and the heat sink 41 is, for example, a Sn—Ag-based, a Sn—Cu-based, a Sn—In-based, or a Sn—Ag—Cu-based solder material (so-called lead-free solder material).

Then, as shown in FIG. 1, the insulating circuit substrate 10 according to the present embodiment is provided with a ceramic substrate 11, the circuit layer 20 arranged on one surface (the upper surface in FIG. 1) of the ceramic substrate 11, and the metal layer 30 arranged on the other surface (lower surface in FIG. 1) of the ceramic substrate 11.

The ceramic substrate 11 is formed of AlN (aluminum nitride), $Si_3N_4$ (silicon nitride), $Al_2O_3$ (alumina), or the like, which have high insulation properties. In the present embodiment, the ceramic substrate 11 is formed of $Si_3N_4$ (silicon nitride) having excellent strength. In addition, the thickness of the ceramic substrate 11 is set in a range of 0.2 to 1.5 mm and is set to 0.32 mm in the present embodiment.

As shown in FIG. 1, the circuit layer 20 has the aluminum layer 21 arranged on one surface of the ceramic substrate 11 and the copper layer 22 laminated on one surface of the aluminum layer 21 via the titanium layer 25.

Here, the thickness of the aluminum layer 21 in the circuit layer 20 is set in a range of 0.1 mm or more and 1.0 mm or less and is set to 0.4 mm in the present embodiment.

In addition, the thickness of the copper layer 22 in the circuit layer 20 is set in a range of 0.1 mm or more and 6.0 mm or less and is set to 1.0 mm in the present embodiment.

As shown in FIG. 1, the metal layer 30 has the aluminum layer 31 arranged on the other surface of the ceramic substrate 11 and a copper layer 32 laminated on the other surface of the aluminum layer 31 via the titanium layer 35.

Here, the thickness of the aluminum layer 31 in the metal layer 30 is set in a range of 0.1 mm or more and 3.0 mm or less and is set to 0.4 mm in the present embodiment.

In addition, the thickness of the copper layer 32 in the metal layer 30 is set in a range of 0.1 mm or more and 6.0 mm or less and is set to 1.0 mm in the present embodiment.

Figure 4:
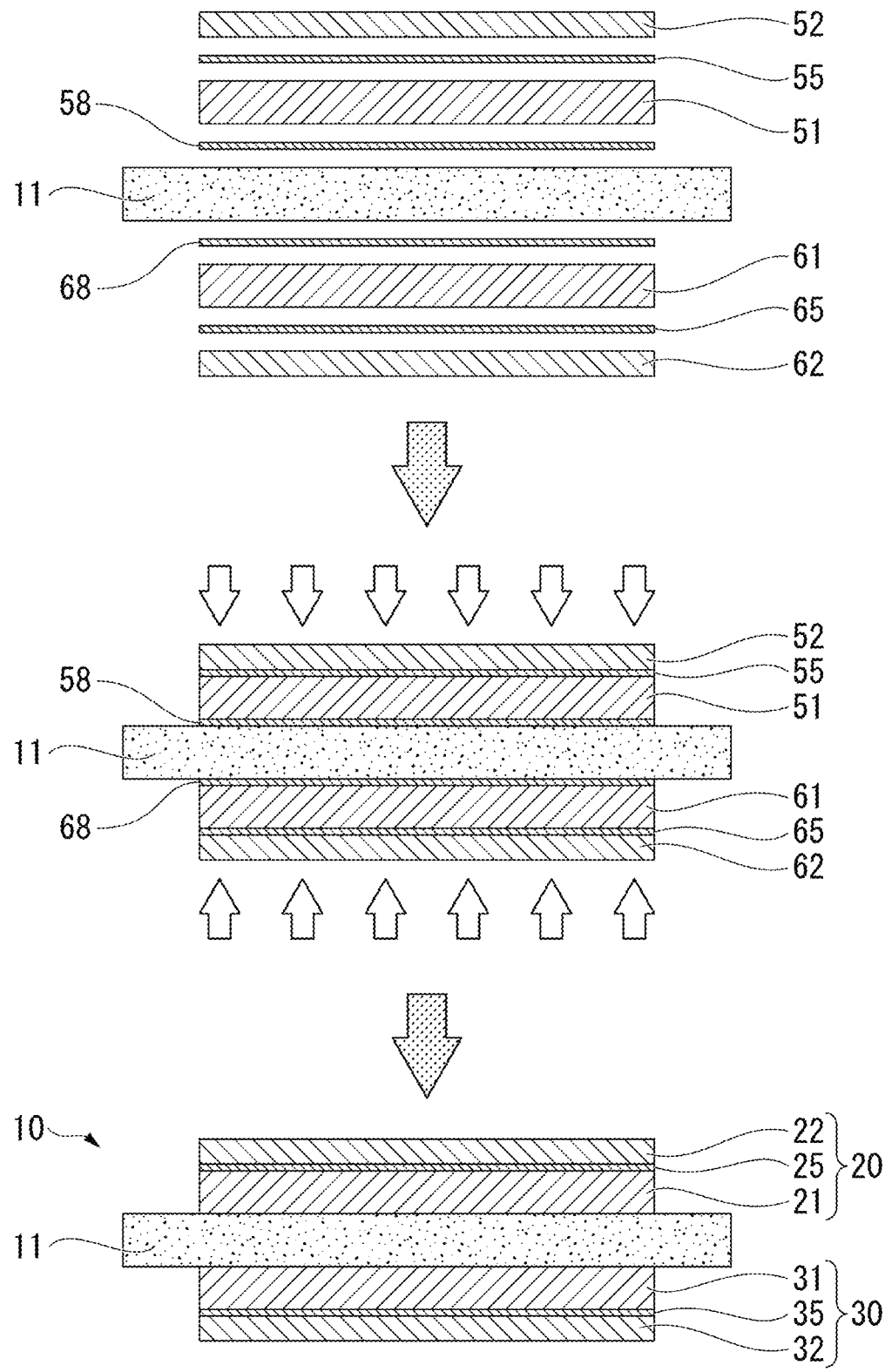
FIG. 4 is an explanatory view showing a method for manufacturing the insulating circuit substrate shown in FIG. 1.

Here, as shown in FIG. 4, the aluminum layers 21 and 31 are provided by bonding aluminum sheets 51 and 61 to one surface and the other surface of the ceramic substrate 11.

The aluminum sheets 51 and 61 to be the aluminum layers 21 and 31 are formed of aluminum (2N aluminum) having a purity of 99 mass % or higher. That is, the Si content is in a range of 0.03 mass % or more and 1.0 mass % or less.

The copper layers 22 and 32 are provided by bonding copper sheets 52 and 62 formed of copper or a copper alloy to one surface and the other surface of the aluminum layers 21 and 31 via the titanium layers 25 and 35, respectively. In the present embodiment, the copper sheets 52 and 62 forming the copper layers 22 and 32 are oxygen-free copper rolled sheets.

The aluminum layers 21 and 31 and the titanium layers 25 and 35 and the titanium layers 25 and 35 and the copper layers 22 and 32 are solid phase diffusion bonded, respectively.

Figure 2:
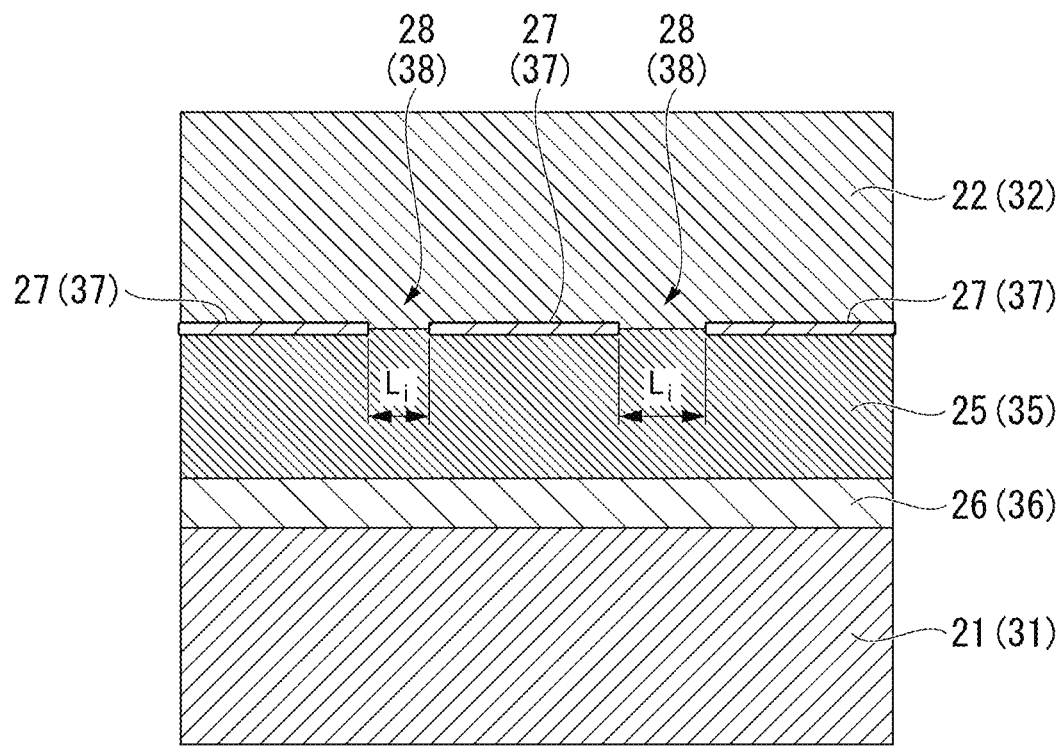
FIG. 2 is an enlarged cross-sectional view of a main part showing the vicinity of a bonded interface of the copper/titanium/aluminum bonded body (circuit layer and metal layer) shown in FIG. 1.

Here, as shown in FIG. 2, Al—Ti—Si layers 26 and 36 are provided at the bonded interfaces between the aluminum layers 21 and 31 and the titanium layers 25 and 35.

The Al—Ti—Si layers 26 and 36 are provided by dissolving the Si of the aluminum layers 21 and 31 in $Al_3Ti$ provided by inter-diffusing the Al atoms of the aluminum layers 21 and 31 and the Ti atoms of the titanium layers 25 and 35.

The thickness of the Al—Ti—Si layers 26 and 36 is set to 0.5 µm or more and 10 µm or less and is 3 µm in the present embodiment.

In addition, as shown in FIG. 2, intermetallic compound phases 27 and 37 containing Ti and Cu are provided at the bonded interfaces between the titanium layers 25 and 35 and the copper layers 22 and 32.

The intermetallic compound phases 27 and 37 are provided by inter-diffusion of Cu atoms in the copper layers 22 and 32 and Ti atoms in the titanium layers 25 and 35.

As shown in FIG. 2, at the bonded interface of the titanium layers 25 and 35 and the copper layers 22 and 32, regions where the intermetallic compound phases 27 and 37 described above are not provided (intermetallic compound unformed parts 28 and 38) may be present.

Here, in the present embodiment, the maximum value of the length $L_i$ of the intermetallic compound unformed parts 28 and 38 along the bonded interface is 20 µm or less.

In addition, the ratio $\Sigma L_i/L_0$ of the total length $\Sigma L_i$ of the intermetallic compound unformed parts 28 and 38 along the bonded interface and the total length $L_0$ of the bonded interface is 0.16 or less.

In the present embodiment, as a result of observing the bonded interface of the titanium layers 25 and 35 and the copper layers 22 and 32, the maximum value of the length $L_i$ of the observed intermetallic compound unformed parts 28 and 38 along the bonded interface is 20 µm or less, and the ratio $\Sigma L_i/L_0$ between the total length $\Sigma L_i$ of the observed intermetallic compound unformed parts 28 and 38 along the bonded interface and the total length $L_0$ of the bonded interface in the observation field of view is 0.16 or less.

When observing the bonded interface of the titanium layers 25 and 35 and the copper layers 22 and 32, cross-section observation of the insulating circuit substrate 10 is performed by EPMA, an element MAP of Cu and Ti in a region (100 µm in length×200 µm in width) including the bonded interface of the titanium layers 25 and 35 and the copper layers 22 and 32 is acquired, regions where the Cu concentration is 5 at % or more and the Ti concentration is 16 at % or more and 70 at % or less are the intermetallic compound phases 27 and 37, and the region between the intermetallic compound phases 27 and 37 at the bonded interface is defined as the length $L_i$ of the intermetallic compound unformed parts 28 and 38 along the bonded interface. This measurement was carried out in 10 fields of view and the maximum value of the length $L_i$ of the intermetallic compound unformed parts 28 and 38 along the bonded interface and the ratio $\Sigma L_i/L$) of the total length $\Sigma L_i$ of the length of the observed intermetallic compound unformed parts 28 and 38 along the bonded interface, to the total length L0 of the bonded interface in the observation field of view were calculated.

Figure 3:
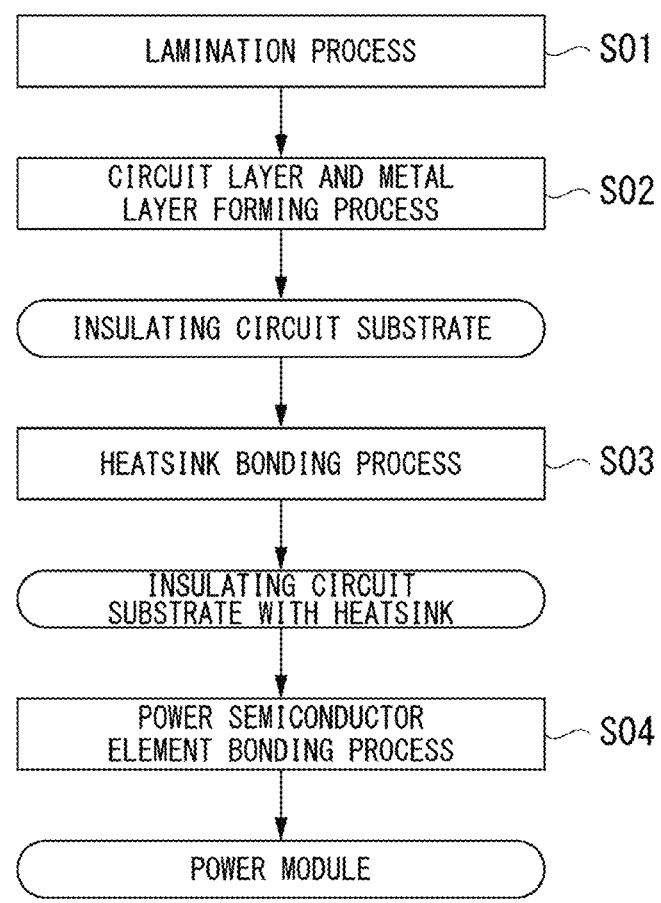
FIG. 3 is a flow chart showing a method for manufacturing the insulating circuit substrate and the power module shown in FIG. 1.

Next, a description will be given of a method for manufacturing the insulating circuit substrate 10 of the present embodiment with reference to FIG. 3 and FIG. 4.

First, as shown in FIG. 4, on one surface (the upper surface in FIG. 4) of the ceramic substrate 11, an aluminum sheet 51 to be the aluminum layer 21 is laminated, and a copper sheet 52 to be the copper layer 22 is further laminated thereon via a titanium material 55. In addition, on the other surface (lower surface in FIG. 4) of the ceramic substrate 11, an aluminum sheet 61 to be the aluminum layer 31 is laminated, and a copper sheet 62 to be the copper layer 32 is further laminated thereon via a titanium material 65. Here, in the present embodiment, the aluminum sheets 51 and 61 and the ceramic substrate 11 were laminated via Al—Si based brazing material foils 58 and 68. (Laminating step S01)

Then, the circuit layer 20 is provided by bonding the aluminum sheet 51 and the ceramic substrate 11 under vacuum conditions by heating in a state of being pressed in a range of 8 kgf/cm² or more and 20 kgf/cm² or less in the laminating direction, and solid-phase diffusing the aluminum sheet 51 and the titanium material 55 and the titanium material 55 and the copper sheet 52. In addition, the metal layer 30 is provided by bonding the aluminum sheet 61 and the ceramic substrate 11 and solid-phase diffusing the aluminum sheet 61 and the titanium material 65 and the titanium material 65 and the copper sheet 62. (Circuit layer and metal layer forming step S02)

Here, in the present embodiment, the vacuum condition is set in a range of $10^{-6}$ Pa or more and $10^{-3}$ Pa or less, the heating temperature is set to 630° C. or higher and 643° C. or lower, and the holding time is set in a range of 210 minutes or more and 360 minutes or less.

Then, in the present embodiment, pressing and heating were performed using a hot press device such that the pressing force was in the range described above at the bonding temperature.

Each of the surfaces of the aluminum sheets 51 and 61, the titanium materials 55 and 65, and the copper sheets 52 and 62 to be bonded are solid-phase diffusion-bonded after scratches on the surfaces are removed and smoothed in advance.

The insulating circuit substrate 10 of the present embodiment is manufactured as described above.

Next, the heat sink 41 is laminated on the metal layer 30 of the insulating circuit substrate 10 via a solder material and solder-bonded in a reducing furnace (heat sink bonding step S03).

In this manner, the insulating circuit substrate with a heat sink 40 of the present embodiment is manufactured.

Next, the power semiconductor element 3 is laminated on one surface (the surface of the copper layer 22) of the circuit layer 20 via a solder material and solder-bonded in a reducing furnace (power semiconductor element-bonding step S04).

The power module 1 of the present embodiment is manufactured as described above.

In the insulating circuit substrate 10 of the present embodiment configured as described above, the circuit layer 20 has a structure in which the aluminum layer 21, the titanium layer 25, and the copper layer 22 are each solid-phase diffused, the metal layer 30 has a structure in which the aluminum layer 31, the titanium layer 35, and the copper layer 32 are each solid-phase diffusion bonded, and, at the bonded interface of the copper layers 22 and 32 and the titanium layers 25 and 35, the maximum value of the length $L_i$ of the intermetallic compound unformed parts 28 and 38, in which the intermetallic compound phases 27 and 37 containing Cu and Ti are not formed, along the bonded interface is 20 µm or less, thus, Cu and Ti are sufficiently inter-diffused between the copper layers 22 and 32 and the titanium layers 25 and 35 and the bonding reliability between the copper layers 22 and 32 and the titanium layers 25 and 35 is excellent.

In addition, at the bonded interface of the copper layers 22 and 32 and the titanium layers 25 and 35, the ratio $\Sigma L_i/L_0$ of the total length $\Sigma L_i$ of the intermetallic compound unformed parts 28 and 38 along the bonded interface and the total length $L_0$ of the bonded interface is 0.16 or less, thus, the ratio of the presence of the intermetallic compound unformed parts 28 and 38 is small and it is possible to suppress peeling from occurring with the intermetallic compound unformed parts 28 and 38 as a starting point even in a case of being subjected to a thermal cycle load at a high temperature.

As described above, since the bonding reliability between the copper layer 22 and the titanium layer 25 in the circuit layer 20 is excellent, even when the power semiconductor element 3 having a high heat generation density is mounted on the circuit layer 20, it is possible to suppress peeling from occurring at the bonded interface of the copper layer 22 and the titanium layer 25.

In addition, since the bonding reliability between the copper layer 32 and the titanium layer 35 in the metal layer 30 is excellent, it is possible to efficiently radiate the heat from the power semiconductor element 3 mounted on the circuit layer 20 to the heat sink 41 side via the metal layer 30.

In addition, in the present embodiment, since the aluminum layers 21 and 31 having a relatively small deformation resistance are formed on one surface and the other surface of the ceramic substrate 11, it is possible to absorb the thermal stress generated when subjected to a thermal cycle load by the deformation of the aluminum layers 21 and 31 and to suppress the generation of fractures in the ceramic substrate 11.

Furthermore, since the copper layers 22 and 32 having relatively large deformation resistance are provided on the surface on the opposite side to the surface of the aluminum layers 21 and 31 on which the ceramic substrate 11 is provided, when subjected to a thermal cycle load, deformation of the surface of the circuit layer 20 and the metal layer 30 is suppressed, it is possible to suppress the generation of fractures in the first solder layer 2 for bonding the circuit layer 20 and the power semiconductor element 3 and the second solder layer 42 for bonding the metal layer 30 and the heat sink 41, and to improve the bonding reliability.

In addition, the present embodiment has a configuration in which the ceramic substrate 11, the aluminum sheets 51 and 61, the titanium materials 55 and 65, and the copper sheets 52 and 62 are bonded in a batch, thus, it is possible to simplify the manufacturing steps and to reduce manufacturing costs.

Further, since the present embodiment has a configuration in which the solid-phase diffusion bonding of the aluminum sheets 51 and 61, the titanium materials 55 and 65, and the copper sheets 52 and 62 is performed by maintaining a temperature at 630° C. or higher and 643° C. or lower in a state where a pressure of 8 to 20 kgf/cm² is applied in the laminating direction, Al atoms and Ti atoms and Ti atoms and Cu atoms are inter-diffused and Al atoms and Cu atoms are solid phase diffused in the titanium material 25 to carry out solid phase diffusion bonding, and it is possible to reliably bond the aluminum sheets 51 and 61, the titanium materials 55 and 65, and the copper sheets 52 and 62.

Then, in the present embodiment, since a hot press device is used such that the pressing force applied in the laminating direction is in the range described above at the heating temperature (bonding temperature), it is possible to sufficiently promote inter-diffusion of the Ti atoms and the Cu atoms between the titanium layers 25 and 35 and the copper layers 22 and 32 and it is possible to set the ratio $\Sigma L_i/L_0$ of the length L of the intermetallic compound unformed parts 28 and 38 along the bonded interface described above and the total length $L_0$ of the bonded interface in the range described above.

Second Embodiment

Figure 5:
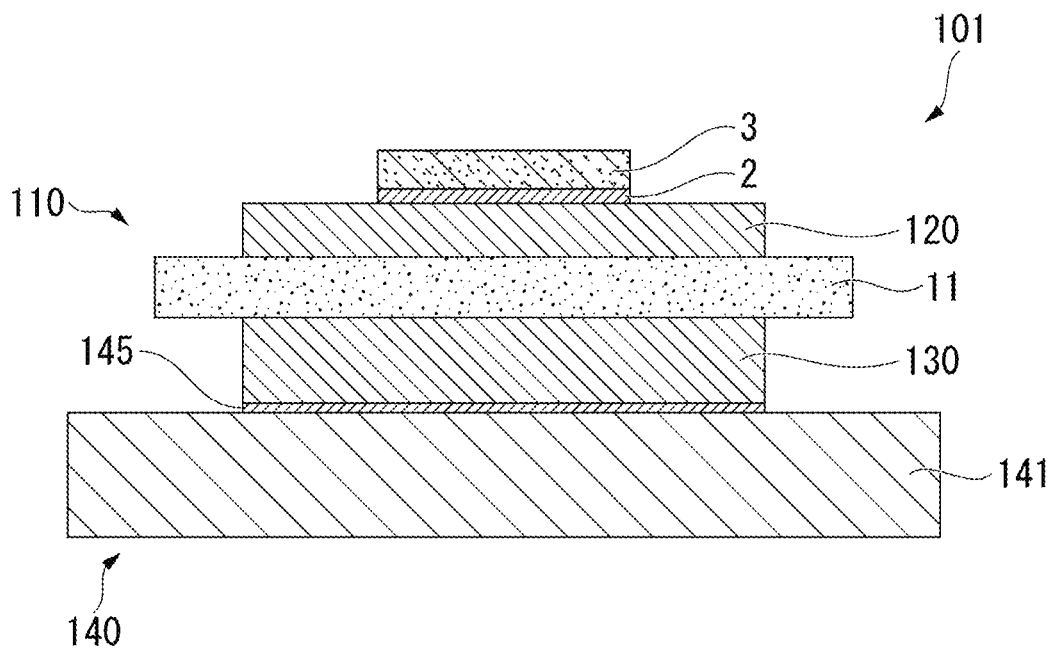
FIG. 5 is a cross-sectional view showing a copper/titanium/aluminum bonded body, an insulating circuit substrate with a heat sink, and a power module according to a second embodiment of the present invention.

FIG. 5 shows a power module 101 using an insulating circuit substrate with a heat sink 140 according to a second embodiment of the present invention. The same members as in the first embodiment are designated by the same reference numerals and detailed description thereof will be omitted.

In addition, in the bonded body in the present embodiment, in the insulating circuit substrate with a heat sink 140 shown in FIG. 5, the metal layer 130 which is an aluminum member and a heat sink 141 which is a copper member are bonded via a titanium layer 145.

The power module 101 shown in FIG. 5 is provided with the insulating circuit substrate with a heat sink 140 and the power semiconductor element 3 bonded to one surface (the upper surface in FIG. 5) of the insulating circuit substrate with a heat sink 140 via the first solder layer 2. In addition, the insulating circuit substrate with a heat sink 140 of the present embodiment is provided with an insulating circuit substrate 110 and the heat sink 141 bonded to the metal layer 130 of the insulating circuit substrate 110.

The heat sink 141 is for radiating heat from the insulating circuit substrate 110 side. The heat sink 141 is formed of copper or a copper alloy and is formed of oxygen-free copper in the present embodiment.

As shown in FIG. 5, the insulating circuit substrate 110 is provided with the ceramic substrate 11, a circuit layer 120 arranged on one surface (the upper surface in FIG. 5) of the ceramic substrate 11, and a metal layer 130 arranged on the other surface (the lower surface in FIG. 5) of the ceramic substrate 11.

Figure 8:
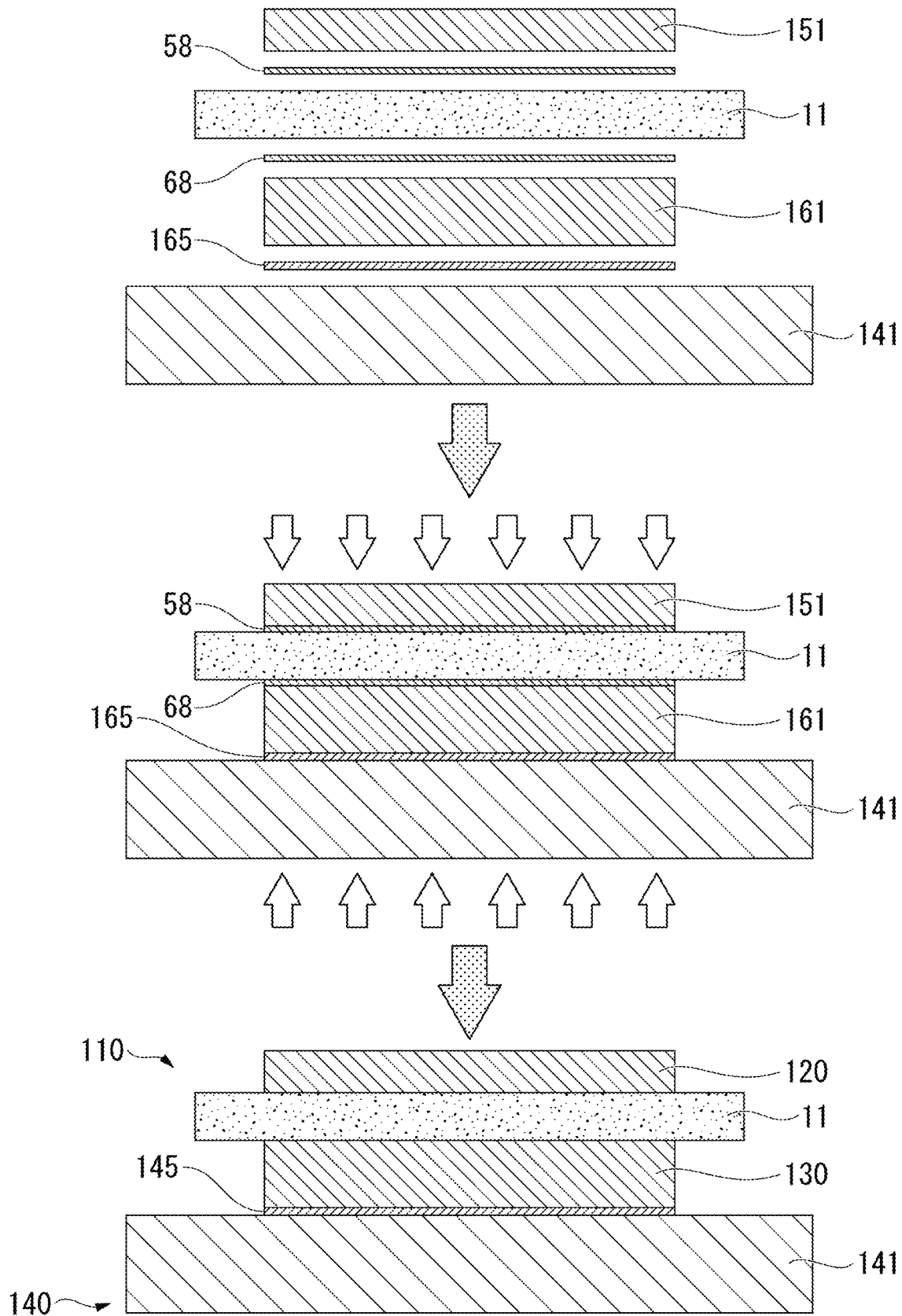
FIG. 8 is an explanatory view showing a method for manufacturing the insulating circuit substrate with a heat sink shown in FIG. 5.

The circuit layer 120 is provided by bonding an aluminum sheet 151 formed of aluminum or an aluminum alloy to one surface (the upper surface in FIG. 8) of the ceramic substrate 11 as shown in FIG. 8. In the present embodiment, the circuit layer 120 is provided by bonding a rolled sheet of aluminum (2N aluminum) having a purity of 99% or more to the ceramic substrate 11. The thickness of the aluminum sheet 151 to be the circuit layer 120 is set in a range of 0.1 nm or more and 1.0 mm or less and is set to 0.6 mm in the present embodiment.

The metal layer 130 is provided by bonding an aluminum sheet 161 to the other surface (the lower surface in FIG. 8) of the ceramic substrate 11 as shown in FIG. 8. In the present embodiment, the aluminum sheet 161 forming the metal layer 130 is a rolled sheet of aluminum (4N aluminum) having a purity of 99.99% by mass or more. The thickness of the aluminum sheet 161 to be bonded is set in a range of 0.1 mm or more and 3.0 mm or less and is set to 0.6 mm in the present embodiment.

Then, as shown in FIG. 5, in the insulating circuit substrate with a heat sink 140 of the present embodiment, the metal layer 130 and the heat sink 141 are bonded via the titanium layer 145.

The metal layer 130 and the titanium layer 145, and the titanium layer 145 and the heat sink 141 are each solid phase diffusion bonded.

Figure 6:
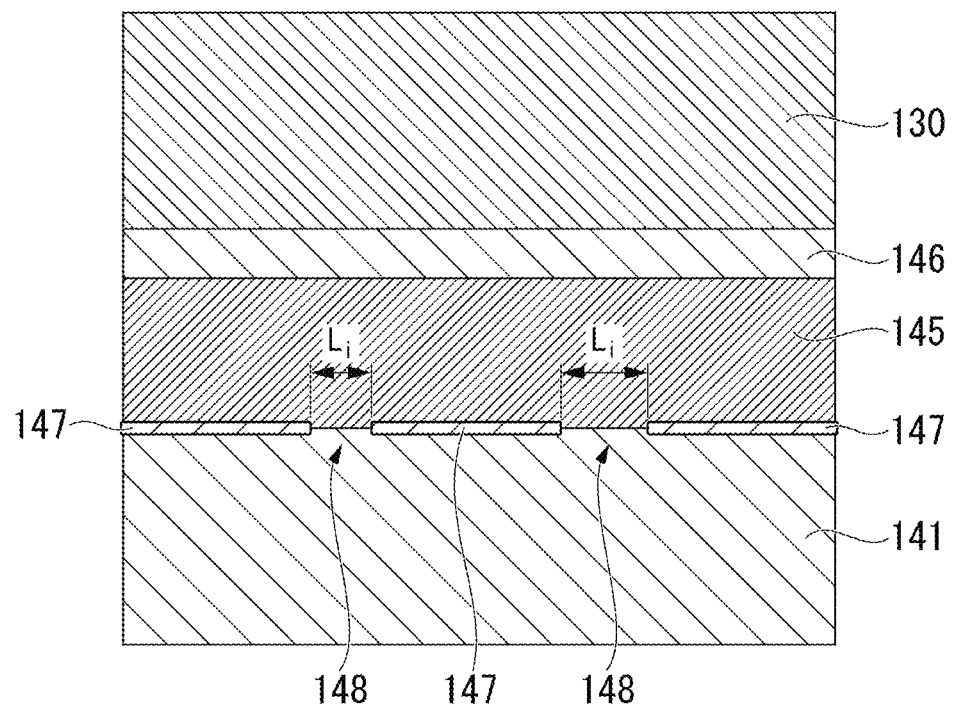
FIG. 6 is an enlarged cross-sectional view of a main part showing the vicinity of a bonded interface of the copper/titanium/aluminum bonded body (metal layer and heat sink) shown in FIG. 5.

Here, an Al—Ti—Si layer 146 is provided at the bonded interface of the metal layer 130 and the titanium layer 145, as shown in FIG. 6.

The Al—Ti—Si layer 146 is provided by solid-dissolving Si of the metal layer 130 in $Al_3Ti$ provided by inter-diffusion of Al atoms of the metal layer 130 and Ti atoms of the titanium layer 145.

The thickness of the Al—Ti—Si layer 146 is set to 0.5 μm or more and 10 μm or less and is 3 gi in the present embodiment.

In addition, as shown in FIG. 6, an intermetallic compound phase 147 containing Ti and Cu is formed at the bonded interface of the titanium layer 145 and the heat sink 141.

The intermetallic compound phase 147 is provided by mutual diffusion of Cu atoms of the heat sink 141 and Ti atoms of the titanium layer 145.

At the bonded interface of the titanium layer 145 and the heat sink 141, as shown in FIG. 2, a region where the intermetallic compound phase 147 described above is not provided (an intermetallic compound unformed part 148) may be present.

Here, in the present embodiment, the maximum value of the length $L_i$ of the intermetallic compound unformed part 148 along the bonded interface is 20 μm or less.

In addition, the ratio $\Sigma L_i/L_O$ of the total length $\Sigma L_i$ of the intermetallic compound unformed part 148 along the bonded interface and the total length $L_O$ of the bonded interface in the observation field of view is 0.16 or less.

Observation of the bonded interface of the titanium layer 145 and the heat sink 141 was carried out under the same conditions as in the first embodiment.

Figure 7:
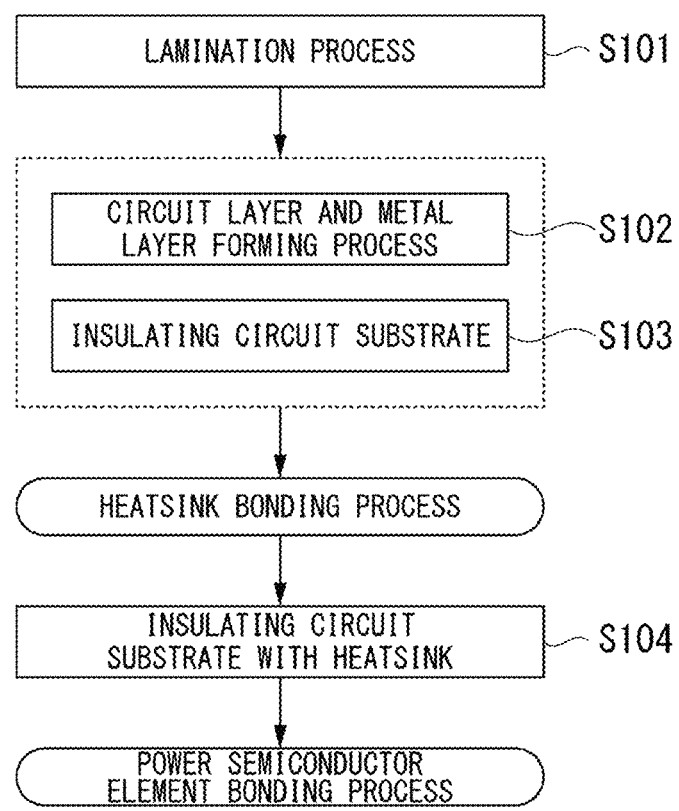
FIG. 7 is a flowchart showing a method for manufacturing the insulating circuit substrate with a heat sink and the power module shown in FIG. 5.

Next, a description will be given of a method for manufacturing the insulating circuit substrate with a heat sink 140 of the present embodiment with reference to FIG. 7 and FIG. 8.

First, as shown in FIG. 8, the aluminum sheet 151 to be the circuit layer 120 is laminated on one surface (the upper surface in FIG. 8) of the ceramic substrate 11, and the aluminum sheet 161 to be the metal layer 130 is laminated on the other surface (the lower surface in FIG. 8) of the ceramic substrate 11. In addition, the heat sink 141 is laminated on the other surface side of the aluminum sheet 161 to be the metal layer 130 via a titanium material 165 (laminating step S101).

In the present embodiment, the aluminum sheets 151 and 161 and the ceramic substrate 11 were laminated via the Al—Si type brazing material foils 58 and 68.

Next, under vacuum conditions, the aluminum sheet 151 and the ceramic substrate 11 are bonded by heating in a state of being pressed in a range of 8 kgf/cm² or more and 20 kgf/cm² or less in the laminating direction, and the circuit layer 120 is provided. In addition, the aluminum sheet 161 and the ceramic substrate 11 are bonded to provide the metal layer 130. (Circuit layer and metal layer providing step S102).

At the same time, the aluminum sheet 161 and the titanium material 165, and the titanium material 165 and the heat sink 141 are solid-phase diffusion bonded (heat sink bonding step S103).

Here, in the present embodiment, the vacuum condition is set in a range of $10^{-6}$ Pa or more and $10^{-3}$ Pa or less, the heating temperature is set to 630° C. or higher and 643° C. or lower, and the holding time is set in a range of 210 minutes or more and 360 minutes or less.

Then, in the present embodiment, pressing and heating were performed using a hot press device such that the pressing force was in the range described above at the bonding temperature.

The respective bonding surfaces of the aluminum sheet 161, the titanium material 165, and the heat sink 141 are solid-phase diffusion bonded after the scratches on the surfaces were removed and smoothed in advance.

The insulating circuit substrate with a heat sink 140 of the present embodiment is manufactured as described above.

Next, the power semiconductor element 3 is laminated on one surface of the circuit layer 120 of the insulating circuit substrate 110 via a solder material and solder bonded in a reducing furnace (power semiconductor element-bonding step S104).

The power module 101 of the present embodiment is manufactured as described above.

The insulating circuit substrate with a heat sink 140 of the present embodiment configured as described above has a structure in which the metal layer 130 which is an aluminum member and the titanium layer 145, and the titanium layer 145 and the heat sink 141 which is a copper member are respectively solid phase diffusion bonded, and, at the bonded interface of the heat sink 141 and the titanium layer 145, the maximum value of the length $L_i$ of the intermetallic compound unformed part 148 where the intermetallic compound phase 147 containing Cu and Ti is not formed along the bonded interface is 20 μm or less, thus, Cu and Ti are sufficiently inter-diffused between the heat sink 141 and the titanium layer 145 and the bonding reliability between the heat sink 141 and the titanium layer 145 is excellent.

In addition, at the bonded interface of the heat sink 141 and the titanium layer 145, the ratio $\Sigma L_i/L_O$ of the total length $\Sigma L_i$ of the intermetallic compound unformed part 148 along the bonded interface and the total length $L_O$ of the bonded interface is 0.16 or less, thus, the ratio of the presence of the intermetallic compound unformed part 148 is small, and it is possible to suppress peeling from occurring with the intermetallic compound unformed part 148 as a starting point even in a case of being subjected to a thermal cycle load at a high temperature.

As described above, the metal layer 130 which is an aluminum member and the heat sink 141 which is a copper member are bonded via the titanium layer 145 and the bonding reliability between the heat sink 141 and the titanium layer 145 is excellent, thus, even in a case of being subjected to a thermal cycle load at a high temperature, it is possible to suppress the generation of peeling at the bonded interface of the heat sink 141 and the titanium layer 145, and to efficiently radiate heat from the power semiconductor element 3 mounted on the circuit layer 120 to the heat sink 141 side via the metal layer 130.

Although embodiments of the present invention were described above, the present invention is not limited thereto and is able to be appropriately changed in a range not departing from the technical idea of the invention.

For example, in the present embodiment, description was given in which the power semiconductor element is mounted on the insulating circuit substrate to form the power module, but the present invention is not limited thereto. For example, an LED element may be mounted on a circuit layer of an insulating circuit substrate to form an LED module, or a thermoelectric element may be mounted on a circuit layer of an insulating circuit substrate to form a thermoelectric module.

Figure 9:
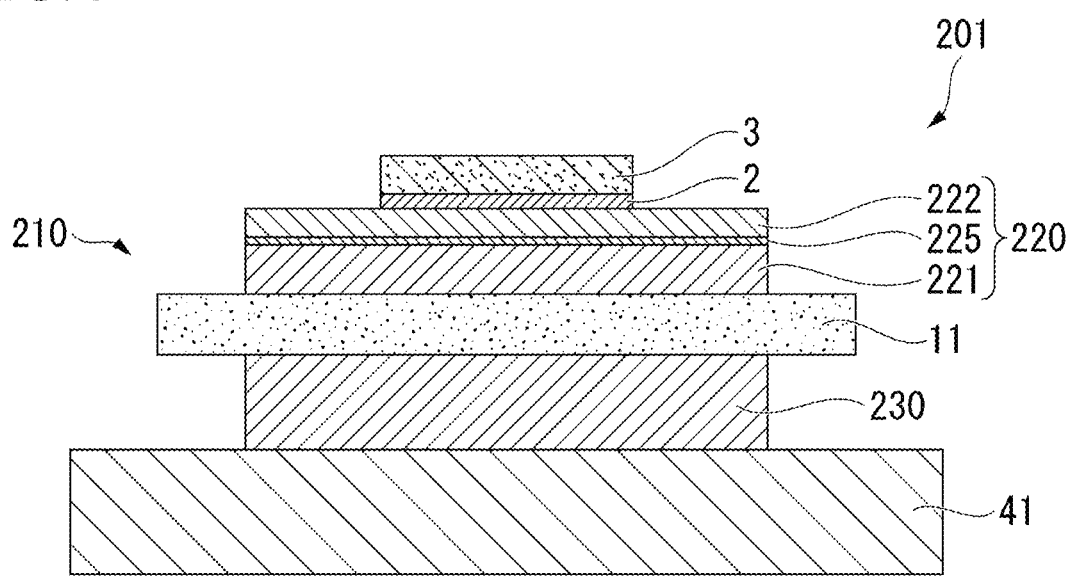
FIG. 9 is a cross-sectional view showing a copper/titanium/aluminum bonded body, an insulating circuit substrate, and a power module which are other embodiments of the present invention.

In addition, as in a power module 201 and an insulating circuit substrate 210 shown in FIG. 9, only a circuit layer 220 may be configured by a copper/titanium/aluminum bonded body obtained by bonding, via a titanium layer 225, a copper member (copper layer 222) formed of copper or a copper alloy and an aluminum member (aluminum layer 221) formed of aluminum or an aluminum alloy.

Figure 10:
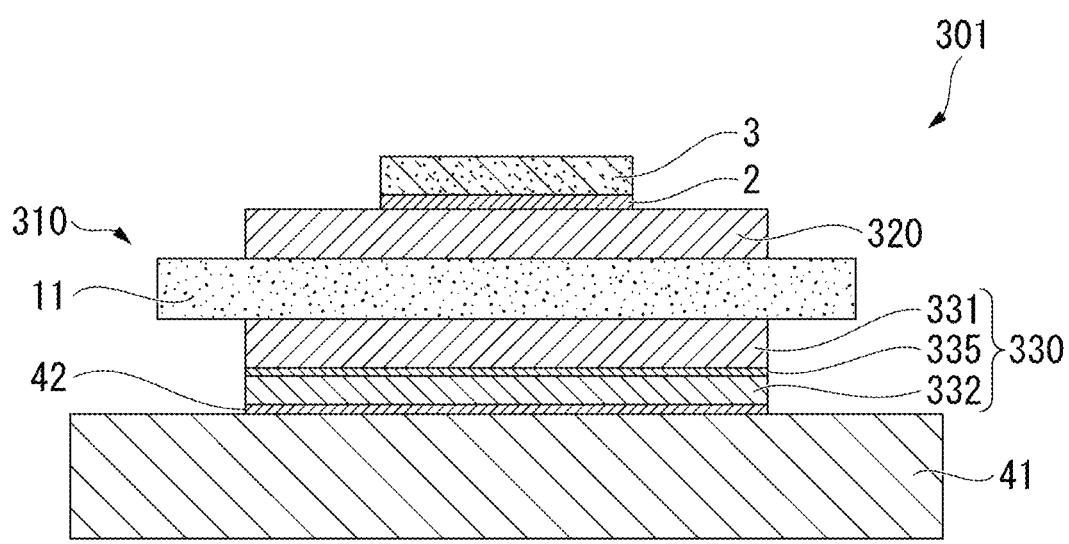
FIG. 10 is a cross-sectional view showing a copper/titanium/aluminum bonded body, an insulating circuit substrate, and a power module which are other embodiments of the present invention.

Alternatively, as in a power module 301 and an insulating circuit substrate 310 shown in FIG. 10, only a metal layer 330 may be configured by the copper/titanium/aluminum bonded body obtained by bonding, via a titanium layer 335, a copper member (copper layer 332) formed of copper or a copper alloy and an aluminum member (aluminum layer 331) formed of aluminum or an aluminum alloy.

Furthermore, in the present embodiment, a description was given of the aluminum layer and the titanium layer as being solid-phase diffusion bonded; however, the present invention is not limited thereto and it is sufficient to have a copper/titanium/aluminum bonded body with a structure in which the titanium layer and the copper layer are solid-phase diffusion bonded and in which an intermetallic compound containing Cu and Ti is formed at the bonded interface of the titanium layer and the copper layer.

EXAMPLES

A description will be given below of the results of confirmation experiments performed to confirm the effects of the present invention.

On one surface and the other surface of the ceramic substrate formed of AlN (40 mm×40 mm×0.635 mmt), an aluminum sheet (37 mm×37 mm×0.6 mmt) formed of aluminum (2N aluminum) having a purity of 99 mass % or more, a titanium material (37 mm×37 mm×0.020 mmt), and a Cu sheet (37 mm×37 mm×0.3 mmt) shown in Table 1 were laminated in this order via a brazing material foil (thickness 10 μm) formed of Al-7 mass % Si alloy to obtain a laminated body.

Then, under a vacuum condition ($5 \times 10^{-4}$ Pa), the laminated body described above was heated in a state of being pressed in the laminating direction at a pressure shown in Table 1 using a hot press device. Here, the bonding conditions were the conditions shown in Table 1. In this manner, the insulating circuit substrates of Examples 1 to 10 of the present invention and Comparative Examples 1 to 3 were obtained.

Figure 11:
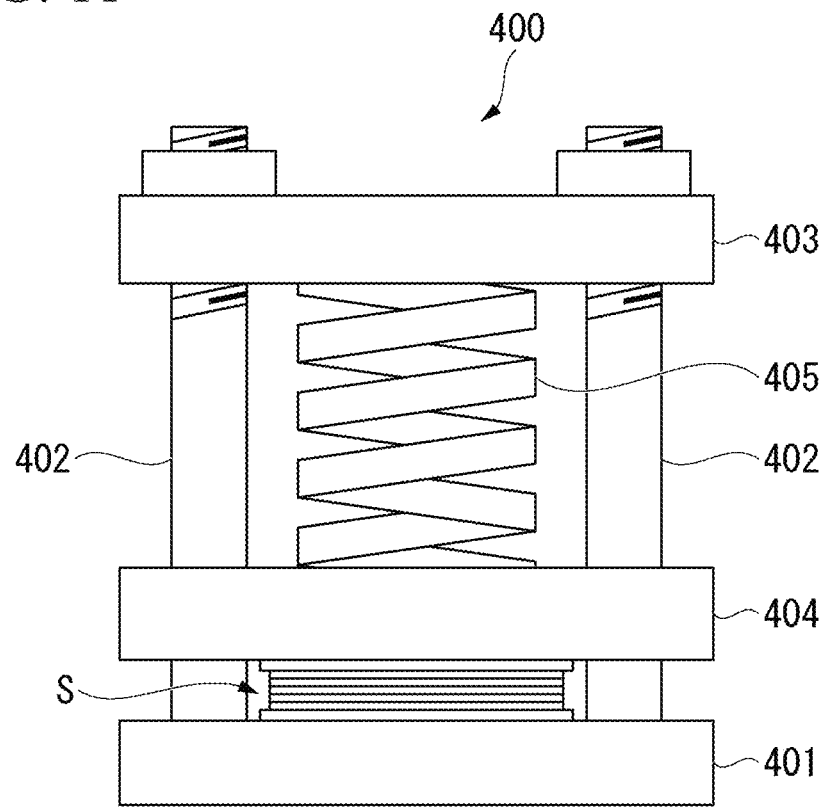
FIG. 11 is an explanatory view of a pressing jig used in a Comparative Example.

On the other hand, in the Conventional Example, the ceramic substrate of the Examples 1 to 10 of the present invention and the Comparative Examples 1 to 3, the brazing material foil, the aluminum sheet, the titanium material, and the Cu sheet shown in Table 1 were laminated in order to obtain a laminated body S. Then, as shown in FIG. 11, the laminated body S described above was pressed using a pressing jig 400 formed of stainless steel and loaded into a vacuum heating furnace. The pressing jig 400 is provided with a base plate 401, guide posts 402 vertically attached to the four corners of the upper surface of the base plate 401, a fixing plate 403 fixed to upper end portions of the guide posts 402, a pressing plate 404 supported by the guide posts 402 so as to be freely vertically movable between the base plate 401 and the fixing plate 403, and an urging means 405, such as a spring, urging the pressing plate 404 downward and provided between the fixing plate 403 and the pressing plate 404, in which the laminated body S described above is arranged between the base plate 401 and the pressing plate 404.

In a case of using the pressing jig with this configuration, the pressing force at the heating temperature is lower than the conditions shown in Table 1 due to the thermal expansion of the guide post 402 and the like of the pressing jig 400.

In this manner, the insulating circuit substrate of the Conventional Example was obtained.

(Intermetallic Compound Unformed part)

With respect to the insulating circuit substrate obtained as described above, the bonded interface of the copper layer and the titanium layer was observed and the length Li of the intermetallic compound unformed part along the bonded interface and the ratio $L_i/L_0$ of the length $L_i$ and the total length $L_0$ of the bonded interface in the observation field of view were measured.

In the present example, the cross-section of the insulating circuit substrate was observed using EPMA (JXA-8539F manufactured by JEOL Ltd.), the elemental MAP of Cu and Ti in a region (100 μm in length×200 μm in width) including a bonded interface of a copper layer and a titanium layer was acquired, a region where the Cu concentration was 5 at % or more and the Ti concentration was 16 at % or more and 70 at % or less was set as the intermetallic compound phase, and a region between the intermetallic compound phases at the bonded interface was set as the length $L_i$ of the intermetallic compound unformed part along the bonded interface.

Figure 12:
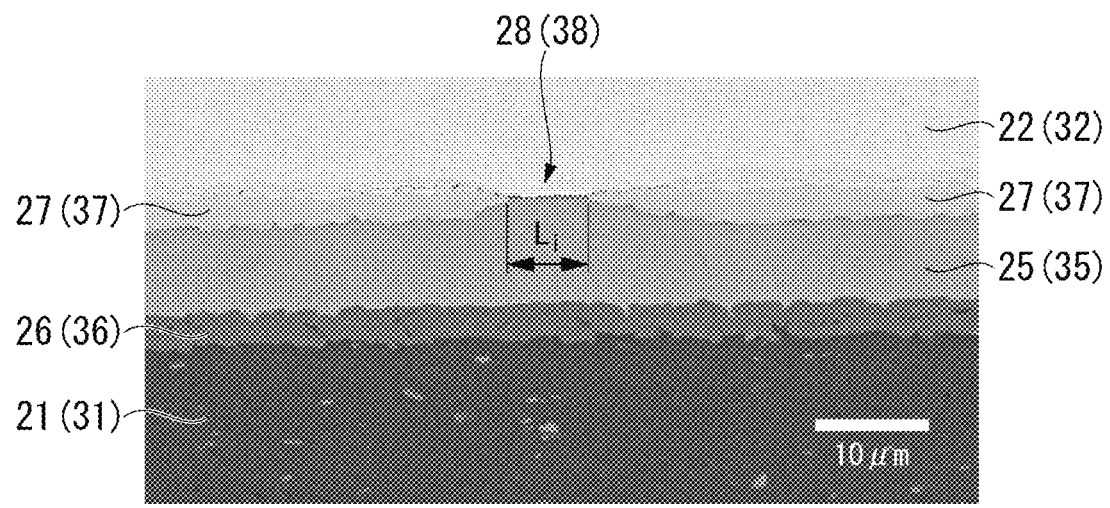
FIG. 12 is a composition image of a cross-section of a bonded interface in a copper/titanium/aluminum bonded body of Example 1 of the present invention.

This measurement was carried out in 10 fields of view and the maximum value of the length $L_i$ of the intermetallic compound unformed part along the bonded interface and the ratio $\Sigma L_i/L_0$ of the total length $\Sigma L_i$ of the observed intermetallic compound unformed part along the bonded interface and the total length L0 of the bonded interface in the observation field of view were calculated. Table 2 shows the evaluation results. In addition, an EPMA image in Example 1 of the present invention is shown in FIG. 12.

(Thermal Cycle Test)

Using a thermal shock tester (TSA-72ES manufactured by ESPEC Corp.), 1000 cycles were carried out on the insulating circuit substrate in a gas phase at −40° C. for 5 minutes and at 175° C. for 5 minutes.

After that, the bonding rate between the copper layer and the titanium layer was evaluated as follows. The bonding rate was evaluated before the thermal cycle test (initial bonding rate) and after the thermal cycle test (post-cycle bonding rate).

The bonding rate was evaluated using an ultrasonic flaw detector (FineSAT200 manufactured by Hitachi Power Solutions Co., Ltd.) for the bonding rate at the interface between the copper layer and the titanium layer on the insulating circuit substrate, and the bonding rate was calculated from the equation below.

Here, the initial bonding area is the area to be bonded before bonding, that is, the area (37 mm×37 mm) of the circuit layer and the metal layer in the present embodiment.

(Bonding rate)={(Initial bonding area)−(exfoliation area)}/(Initial bonding area)×100

In an image obtained by binarizing the ultrasonic-detected image, the peeling was indicated by the white portion inside the bonded portion such that the area of this white portion was defined as the exfoliation area.

These results are shown in Table 2.

TABLE 1

| | | Bonding conditions | | | |
|---|---|---|---|---|---|
| | Copper sheet Material | Method | Bonding temperature (° C.) | Holding time (min) | Pressurizing load (MPa) |
| Example 1 of the present invention | OFC | Hot press | 635 | 210 | 20 |
| Example 2 of the present invention | OFC | Hot press | 630 | 210 | 20 |
| Example 3 of the present invention | OFC | Hot press | 643 | 210 | 8 |
| Example 4 of the present invention | OFC | Hot press | 643 | 360 | 15 |
| Example 5 of the present invention | OFC | Hot press | 643 | 360 | 12 |
| Example 6 of the present invention | OFC | Hot press | 643 | 300 | 12 |
| Example 7 of the present invention | OFC | Hot press | 643 | 270 | 15 |
| Example 8 of the present invention | Phosphorus deoxidized copper | Hot press | 643 | 300 | 12 |
| Example 9 of the present invention | Tough pitch copper | Hot press | 643 | 300 | 12 |
| Example 10 of the present invention | OFC | Hot press | 643 | 240 | 8 |
| Comparative Example 1 | OFC | Hot press | 620 | 270 | 15 |
| Comparative Example 2 | OFC | Hot press | 635 | 60 | 15 |
| Comparative Example 3 | OFC | Hot press | 643 | 270 | 5 |
| Conventional Example | OFC | Pressing jig | 643 | 270 | 15 |

TABLE 2

| | Intermetallic compound unformed part | | Bonding ratio | |
|---|---|---|---|---|
| | Length $L_i$ [μm] | Length ratio $\Sigma L_i/L_0$ | Before thermal cycle test | After thermal cycle test |
| Example 1 of the present invention | 20 | 0.12 | 99.4 | 91.1 |
| Example 2 of the present invention | 12 | 0.16 | 99.2 | 90.6 |
| Example 3 of the present invention | 4 | 0.11 | 97.7 | 93.1 |
| Example 4 of the present invention | 10 | 0.05 | 99.9 | 96.0 |
| Example 5 of the present invention | 9 | 0.06 | 98.2 | 95.9 |

TABLE 2-continued

|  | Intermetallic compound unformed part | | Bonding ratio | |
| --- | --- | --- | --- | --- |
|  | Length $L_i$ [μm] | Length ratio $\Sigma L_i/L_0$ | Before thermal cycle test | After thermal cycle test |
| Example 6 of the present invention | 7 | 0.07 | 97.5 | 95.5 |
| Example 7 of the present invention | 6 | 0.10 | 98.7 | 94.4 |
| Example 8 of the present invention | 13 | 0.07 | 99.1 | 95.0 |
| Example 9 of the present invention | 4 | 0.07 | 98.3 | 94.6 |
| Example 10 of the present invention | 5 | 0.10 | 99.9 | 93.3 |
| Comparative Example 1 | 37 | 0.25 | 98.0 | 86.5 |
| Comparative Example 2 | 13 | 0.28 | 98.0 | 85.7 |
| Comparative Example 3 | 31 | 0.13 | 98.2 | 87.4 |
| Conventional Example | 42 | 0.29 | 99.0 | 82.0 |

In Comparative Example 1, the bonding temperature was set as low as 620° C., the intermetallic compound unformed part length Li was 37 μm, which was larger than the range of the present invention, and the length ratio ΣLi/L0 described above was 0.25, which was larger than the range of the present invention. Due to this, the bonding rate after the thermal cycle test was lowered to 86.5%.

In Comparative Example 2, the holding time at the bonding temperature was set to be short at 60 min and the length ratio ΣLi/L0 described above was 0.28, which was larger than the range of the present invention. Due to this, the bonding rate after the thermal cycle test was lowered to 85.7%.

In Comparative Example 3, the pressure load was set to be low at 5 kgf/cm² and the intermetallic compound unformed part length Li was 31 μm, which was larger than the range of the present invention. Due to this, the bonding rate after the thermal cycle test was lowered to 87.4%.

In the Conventional Examples, since pressure was applied using the pressing jig shown in FIG. 11, the pressure load was low at the pressure temperature, the intermetallic compound unformed part length Li was as large as 42 μm, and the length ratio Li/L0 described above was 0.29, which was larger than the range of the present invention. Due to this, the bonding rate after the thermal cycle test was lowered to 82.0%.

On the other hand, in Invention Examples 1 to 10 in which the length Li of the intermetallic compound unformed part was 20 μm or less and the length ratio ΣLi/L0 described above was 0.16 or less, the bonding rates after the thermal cycle test were all 90.6% or more and the bonding reliability in the thermal cycle test was excellent. In addition, in Invention Examples 1 to 7, 10 and Example 8 of the present invention and Example 9 of the present invention, the material of the copper sheet was changed, but the bonding rate after the thermal cycle was high in all cases.

From the above, according to the Invention Examples, even in a case of being subjected to a thermal cycle load at a temperature higher than in the related art, it was possible to suppress peeling from occurring at the bonded interface of the copper member and the titanium layer and it was possible to obtain a copper/titanium/aluminum bonded body having particularly excellent reliability.

INDUSTRIAL APPLICABILITY

According to the present invention, it is possible to provide a copper/titanium/aluminum bonded body in which it is possible to suppress peeling from occurring at a bonded interface of a copper member and a titanium layer even in a case of being subjected to a thermal cycle load at a temperature higher than in the related art and in which the reliability is particularly excellent, as well as an insulating circuit substrate, an insulating circuit substrate with a heat sink, a power module, an LED module, and a thermoelectric module, which are provided with the same.

REFERENCE SIGNS LIST

1: Power module
3: Power semiconductor element
10: Insulating circuit substrate
11: Ceramic substrate
20: Circuit layer
30: Metal layer
21, 31: Aluminum layer (aluminum member)
22, 32: Copper layer (copper member)
25, 35: Titanium layer
27, 37: Intermetallic compound phase
28, 38: Intermetallic compound unformed part
101: Power module
110: Insulating circuit substrate
130: Metal layer (aluminum member)
141: Heat sink (copper member)
140: Insulating circuit substrate with heat sink

The invention claimed is:

1. A copper/titanium/aluminum bonded body in which a copper member made of copper or a copper alloy and an aluminum member made of aluminum having a purity of 99 mass % or more are bonded via a titanium layer,
   wherein an intermetallic compound containing Cu and Ti and an intermetallic compound unformed part which is a part free of formation of the intermetallic compound are formed at a bonded interface of the copper member and the titanium layer,
   a maximum value of a length $L_i$ of the intermetallic compound unformed part along the bonded interface is 4 μm or more and 20 μm or less in the bonded interface of the copper member and the titanium layer, a ratio $\Sigma L_i/L_O$ is 0.16 or less, $\Sigma L_i$ being a total length of the intermetallic compound unformed part along the bonded interface and of $L_O$ being a total length of the bonded interface along the bonded interface, the length $L_i$ is a region between intermetallic compound phases at the bonded interface, and the intermetallic compound phases are regions, where the Cu concentration is 5 at % or more and 84 at % or less and the Ti concentration is 16 at % or more and 70 at % or less, in a concentration distribution of Cu and Ti of a region including the bonded interface of the copper member and the titanium layer using an electron probe micro-analyzer (EPMA).

2. An insulating circuit substrate comprising:
a ceramic substrate; and
a circuit layer provided on one surface of the ceramic substrate,
wherein the circuit layer is the copper/titanium/aluminum bonded body according to claim 1.

3. An insulating circuit substrate comprising:
a ceramic substrate;
a circuit layer provided on one surface of the ceramic substrate; and
a metal layer provided on the other surface of the ceramic substrate,
wherein the metal layer is the copper/titanium/aluminum bonded body according to claim 1.

4. An insulating circuit substrate comprising:
a ceramic substrate;
a circuit layer provided on one surface of the ceramic substrate; and
a metal layer provided on the other surface of the ceramic substrate,
wherein the circuit layer and the metal layer are the copper/titanium/aluminum bonded body according to claim 1.

5. An insulating circuit substrate with a heat sink comprising:
a ceramic substrate;
a circuit layer provided on one surface of the ceramic substrate;
a metal layer provided on the other surface of the ceramic substrate; and
the heat sink bonded to the metal layer via a titanium layer,
wherein the metal layer, the titanium layer, and the heat sink are the copper/titanium/aluminum bonded body according to claim 1.

6. A power module comprising:
the insulating circuit substrate according to claim 4; and
a power semiconductor element bonded to one surface side of the circuit layer.

7. A power module comprising:
the insulating circuit substrate with the heat sink according to claim 5; and
a power semiconductor element bonded to one surface side of the circuit layer.

8. An LED module comprising:
the insulating circuit substrate according to claim 4; and
an LED element bonded to one surface side of the circuit layer.

9. An LED module comprising:
the insulating circuit substrate with the heat sink according to claim 5; and
an LED element bonded to one surface side of the circuit layer.

10. A thermoelectric module comprising:
the insulating circuit substrate according to claim 4; and
a thermoelectric element bonded to one surface side of the circuit layer.

11. A thermoelectric module comprising:
the insulating circuit substrate with the heat sink according to claim 5; and
a thermoelectric element bonded to one surface side of the circuit layer.

12. The copper/titanium/aluminum bonded body according to claim 1, wherein
the aluminum member and the titanium layer and the titanium layer and the copper member are solid phase diffusion bonded, respectively.

13. The copper/titanium/aluminum bonded body according to claim 1, wherein
a Al—Ti—Si layer is formed between the aluminum member and the titanium layer.

14. The copper/titanium/aluminum bonded body according to claim 13, wherein
a thickness of the Al—Ti—Si layer is 0.5 μm or more and 10 μm or less.

15. The copper/titanium/aluminum bonded body according to claim 1, wherein
the ratio $\Sigma L_i/L_O$ is 0.05 or more.

16. The copper/titanium/aluminum bonded body according to claim 1, wherein
the region including the bonded interface of the copper member and the titanium layer is 100 μm in length and 200 μm in width, and
a measurement using the EPMA is carried out in 10 fields of view.

* * * * *